United States Patent [19]
Ottesen et al.

[11] Patent Number: 5,377,131
[45] Date of Patent: Dec. 27, 1994

[54] DIGITAL AMPLITUDE ESTIMATOR

[75] Inventors: Hal H. Ottesen; Gordon J. Smith, both of Rochester, Minn.

[73] Assignee: International Business Machines Corporation, Armonk, N.Y.

[21] Appl. No.: 999,047

[22] Filed: Dec. 31, 1992

[51] Int. Cl.$^5$ .............................................. G06F 15/31
[52] U.S. Cl. ............................................. 364/724.01
[58] Field of Search .............. 364/724.01, 752, 715.03, 364/724.10, 721, 727, 723

[56] References Cited

U.S. PATENT DOCUMENTS

| | | | |
|---|---|---|---|
| 4,679,103 | 7/1987 | Workman | 360/77 |
| 4,707,841 | 11/1987 | Yen et al. | 375/106 |
| 4,907,107 | 3/1990 | Sakurai | 360/77.04 |
| 4,931,887 | 6/1990 | Hedge et al. | 360/75 |
| 5,293,369 | 3/1994 | Melas et al. | 364/723 |

FOREIGN PATENT DOCUMENTS 2260174 10/1990 Japan .

Primary Examiner—David H. Malzann
Attorney, Agent, or Firm—Homer L. Knearl; Matthew J. Bussan

[57] ABSTRACT

Amplitude information is derived from a periodic waveform by digitally sampling the periodic waveform, filtering a digital harmonic signal out of the digital sample sequence of the periodic waveform, and computing the root mean square of the digital Mth harmonic signal over a predetermined number of successive samplings of the periodic waveform. The digital sampling is done at a rate such that there will be an integer number of samples "L" over the period of the first harmonic component of the digital sample sequence of the waveform signal. The root mean square value computation is simplified by selecting the sampling window width N and the harmonic M so that there is a predetermined relationship to a critical sampling number L given by the expression, $L=(4MN)/(2j+1)$ where $j=0, 1, 2, \ldots$. As long as this relationship is satisfied, the RMS value can be computed by summing the absolute value of selected digital amplitude values of the selected harmonic component of the digitized signal. Further, the RMS values may be averaged by nesting a number of successive indexed RMS value computations.

5 Claims, 5 Drawing Sheets

| $j$ | N | L | $A_3(n)$ |
|---|---|---|---|
| 0 | 1 | 12 | $\sqrt{y_3^2(n)+y_3^2(n+1)}$ |
| 1 | 1 | 4 | $\sqrt{y_3^2(n)+y_3^2(n+1)}$ |
| 1 | 2 | 8 | $\sqrt{y_3^2(n)+y_3^2(n+2)}$ |
| 2 | 5 | 12 | $\sqrt{y_3^2(n)+y_3^2(n+5)}$ |
| 3 | 7 | 12 | $\sqrt{y_3^2(n)+y_3^2(n+7)}$ |
| ⋮ | ⋮ | ⋮ | ⋮ |

P

| | 2 | 4 | 6 | 8 | 10 | 12 |
|---|---|---|---|---|---|---|
| 0 | 1 | 1 | 1 | 1 | 1 | 1 |
| 1 | 2 | 2 | 2 | 2 | 2 | 2 |
| 2 | 2 | 4 | 4 | 4 | 4 | 4 |
| 3 | 2 | 6 | 6 | 6 | 6 | 6 |
| 4 | 1 | 6 | 8 | 8 | 8 | 8 |
| 5 | 0 | 6 | 10 | 10 | 10 | 10 |
| 6 | 0 | 4 | 10 | 12 | 12 | 12 |
| 7 | 0 | 2 | 10 | 14 | 14 | 14 |
| 8 | 0 | 1 | 8 | 14 | 16 | 16 |
| 9 | 0 | 0 | 6 | 14 | 18 | 18 |
| 10 | 0 | 0 | 4 | 12 | 18 | 20 |
| 11 | 0 | 0 | 2 | 10 | 18 | 22 |
| 12 | 0 | 0 | 1 | 8 | 16 | 22 |
| 13 | 0 | 0 | 0 | 6 | 14 | 22 |
| 14 | 0 | 0 | 0 | 4 | 12 | 20 |
| 15 | 0 | 0 | 0 | 2 | 10 | 18 |
| 16 | 0 | 0 | 0 | 1 | 8 | 16 |
| 17 | 0 | 0 | 0 | 0 | 6 | 14 |
| 18 | 0 | 0 | 0 | 0 | 4 | 12 |
| 19 | 0 | 0 | 0 | 0 | 2 | 10 |
| 20 | 0 | 0 | 0 | 0 | 1 | 8 |
| 21 | 0 | 0 | 0 | 0 | 0 | 6 |
| 22 | 0 | 0 | 0 | 0 | 0 | 4 |
| 23 | 0 | 0 | 0 | 0 | 0 | 2 |
| 24 | 0 | 0 | 0 | 0 | 0 | 1 |

SHIFT REGISTER STAGES

DIGITAL AMPLITUDE ESTIMATOR

CROSS REFERENCE TO RELATED APPLICATIONS

U.S. patent application Ser. No. 07/999,628, filed Dec. 31, 1992, entitled "Bias Servo Loop For Magneto-Resistive Read/Write Head," and invented by H. H. Ottesen et al, now U.S. Pat. No. 5,301,080, describes a bias current servo loop that makes use of the present invention.

U.S. patent application Ser. No. 07/999,036, filed Dec. 31, 1992, entitled "Fly Height Servo Control of Read/Write Suspension," and invented by D. L. Good et al, describes a fly height servo loop in which the present invention is used.

BACKGROUND OF THE INVENTION

1. Field of the Invention

This invention is directed to a method and apparatus for deriving amplitude information from periodic waveforms. More particularly, the invention relates to estimating amplitude information from periodic waveforms by estimating the amplitude of harmonic components filtered from digitized sample sequences of the periodic waveforms.

2. Description of Prior Art

The classical means for extracting the amplitude information has been to rectify the signal, then use peak detection apparatus followed by a low-pass filter. The peak detection process can also be implemented with a digital signal processor. The continuous periodic waveform is digitized by a sampling circuit, and the digital signal processor is programmed to perform the above peak detection process.

Either implementation of the peak detection process requires significant amounts of hardware and/or software to implement. Further, the peak detection process only offers two samples per sinusoidal cycle. Accordingly, in peak detection applications, the designer is trading off accuracy of amplitude information against the number of cycles sampled. For accurate amplitude information, many cycles of the periodic waveform must by used.

SUMMARY OF THE INVENTION

It is an object of this invention to reduce the hardware and/or software required to derive amplitude information from a periodic waveform.

It is a further object of this invention to reduce the number of cycles of the periodic waveform that must be sampled to derive accurate harmonic amplitude information from the periodic waveform.

In accordance with this invention, the above objects are accomplished by digitally sampling the periodic waveform, filtering a digital harmonic signal out of the digital sample sequence of the periodic waveform, and computing the root mean square of the digital harmonic signal over a predetermined number of successive samplings of the periodic waveform. The digital sampling is done at a rate such that there will be an integer number of samples "L" over the period of the first harmonic component of the digital sample sequence of the waveform signal. The root mean square value computation is simplified by selecting the sample window spacing N and the harmonic M whose RMS value is being computed, so that there is a predetermined relationship to the critical sampling number L given by the expression, $L=(4MN)/(2j+1)$ where $j=0, 1, 2, \ldots$. As long as this relationship is satisfied, the RMS value can be computed by summing the absolute value of selected digital amplitude values of the selected harmonic component of the digitized signal. Further, the RMS values may be averaged by nesting a number of successive indexed RMS value computations.

This invention may be used in deriving amplitude information from periodic waveforms in many applications, such as (1) fly height or gain control in magnetic or optical read signals from disk drives, (2) digital radio, (3) television or any other digital process deriving amplitude information from a periodic waveform. The invention results in an order of magnitude improvement in the accuracy of the amplitude information for the same number of digital samples used in conventional peak detection processes.

Other objects, advantages and features of the invention will be understood by those of ordinary skill in the art after referring to the complete written description of the preferred embodiments in conjunction with the following drawings.

BRIEF DESCRIPTION OF THE DRAWINGS

FIG. 5 is a table of coefficients for summing from a shift register to extend the averaging of the RMS value.

DESCRIPTION OF THE PREFERRED EMBODIMENTS

Figures 1, 4:
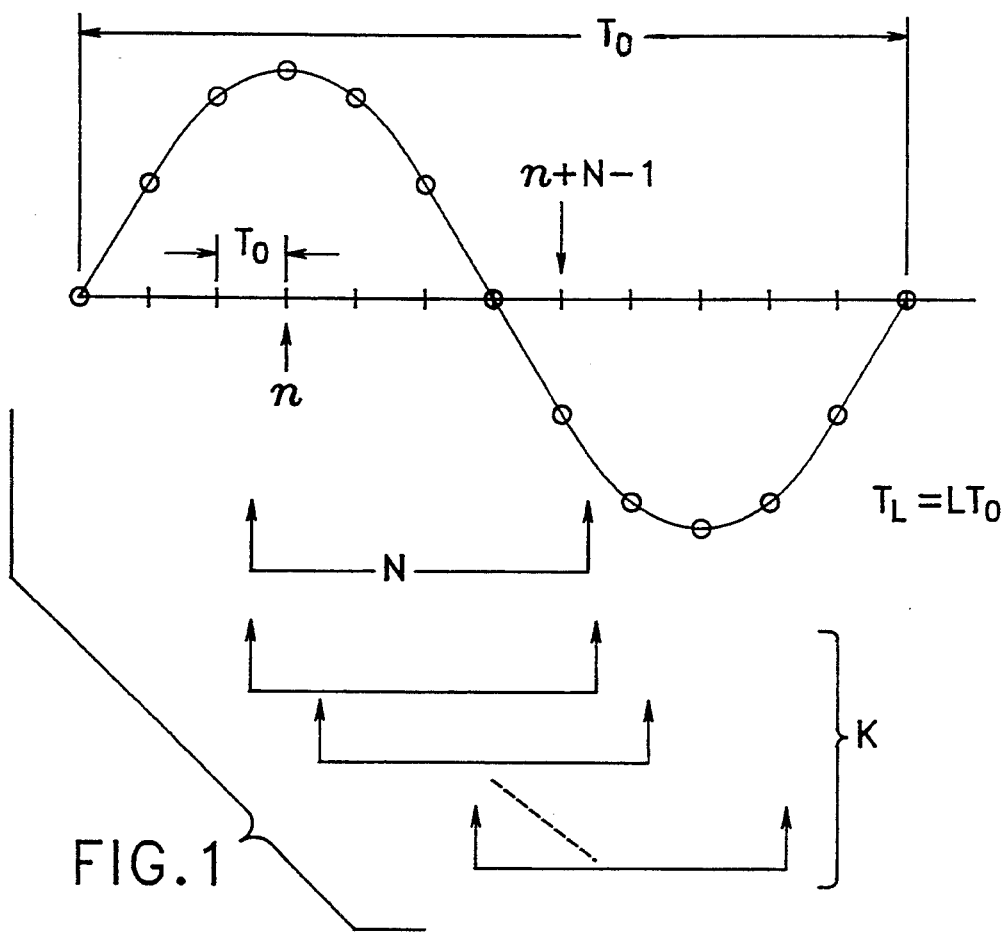
FIG. 1 shows an example of one cycle of the first harmonic, and illustrates the sampling interval $T_o$, the sampling index n, the sampling window spacing N, the fundamental period $T_L$, and the nested window index K.
FIG. 4 is a table illustrating choices for N and L when the amplitude of the third harmonic, M=3, is being estimated.

In FIG. 1, the first harmonic of the signal is digitized from the periodic waveform. The first harmonic has a fundamental period $T_L$, and is sampled at each sampling interval $T_o$. There are L sampling intervals equally distributed in one cycle of the first harmonic; i.e., $T_L = L*T_o$. The sampling points are indicated as dots on the first harmonic in FIG. 1.

The sampling index number "n" is simply an index number for tracking the relationship between samples in the digital expressions. The width of the sampling window is "N" samples; in the example of FIG. 1, the sampling window N collects five sampling values. To obtain the RMS value the sampling window is indexed "K" times as indicated in FIG. 1.

The integers L, M and N are interrelated by the critical sampling number (CSN) expression $L=(4MN)/(2j+1)$ where $j=0, 1, 2, \ldots$. The derivation of this expression will be explained hereinafter under the heading Theory of Operation. In a typical application of the invention, the harmonic signal number M would be determined by the desired use of the amplitude estimator, and N and L would be selected as integers to satisfy the CSN expression. L, the CSN, defines the critical fundamental period $T_L$ by the relationship $T_L = L*T_o$.

Figure 2:
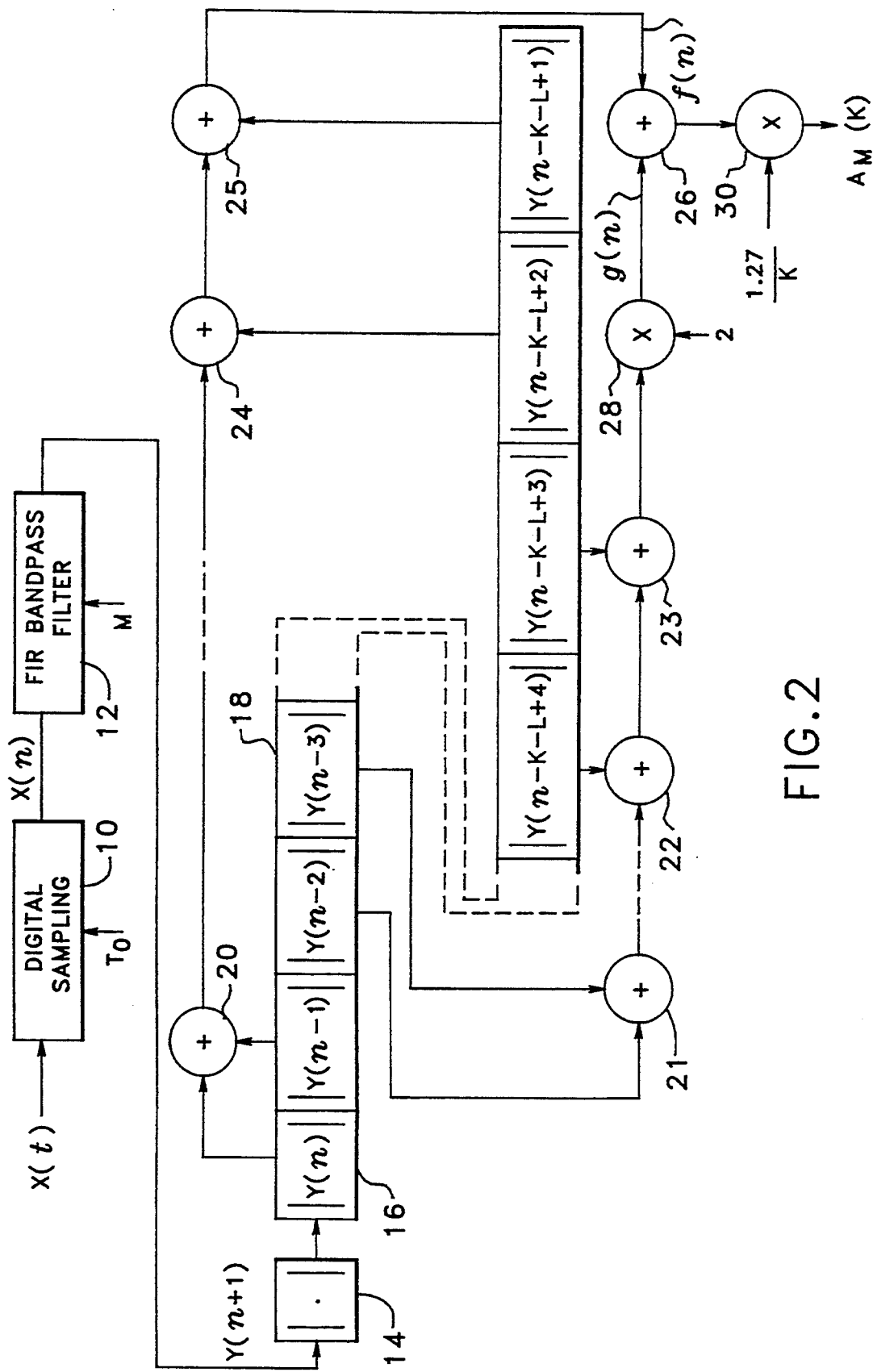
FIG. 2 shows one embodiment of the invention implementing the amplitude estimator by summing absolute values of a harmonic amplitude as the values are passed through a shift register.

The preferred embodiment of the invention in hardware logic is shown in FIG. 2. The continuous periodic waveform X(t) is digitized by digital sampling circuit 10. The sampling interval $T_o$ is adjusted, as discussed above, to make the critical sampling number L an integer. The digital sample values or digitized signal X(n) is passed to FIR (Finite Impulse Response) bandpass filter 12. Filter 12 will separate the harmonics in the digitized signal X(n) according to the harmonic number M. The output from the filter 12 is the Mth harmonic as selected by the harmonic integer M input to the filter. An example of a second harmonic FIR bandpass filter is described in the cross-referenced patent application Ser. No. 07/999,628. For each digitized sample value X(n), FIR filter 12 will output an amplitude value Y(n) of the Mth harmonic component of the digitized signal X(n).

The amplitude value Y(n) of the Mth harmonic component is converted to an absolute value by absolute value logic 14. Logic 14 is easily implemented in binary digital system by using two's complement to convert negative values of Y(n). After conversion to absolute value, |Y(n)| is loaded into the first stage 16 of shift register 18. The loading and shifting of the register 18 occurs with each new sample n of the digitized signal X(n).

Selected stages of the shift register are summed by summing circuits 20-26, and the sums multiplied by fixed factors in multiplication circuits 28 and 30 to compute the RMS value of the amplitude of the Mth harmonic. The digitized RMS value is given by this expression:

$$A_M(K) = [1.27/K] * \sum_{i=0}^{K-1} [|Y_M(n+i)| + |Y_M(n+N+i)|]$$

In the preferred embodiment, Y(n) is averaged over K+L sampling points. Therefore, averaging the RMS value $A_M(K)$ over K intervals requires the shift register to have K+L stages. Further, if the above expression for $A_M(K)$ is expanded, one finds that sums from all but the first two stages and the last two stages must be multiplied by a factor of 2. Accordingly, the averaging RMS value expression can be factored as follows:

$$A_M(K) = [1.27/K]*[f(n) + g(n)]$$

Where:

$$f(n) = |Y(n)| + |Y(n-1)| + |Y(n-K-L+2)| + |Y(n-K-L+1)|$$

$$g(n) = 2 * \sum_{i=2}^{(K+L-3)} |Y(n-i)|$$

In FIG. 2, summing circuits 20, 24 and 25 sum the contents of the first two and last two stages of the shift register 18 to generate f(n). Summing circuits 21, 22 and 23 sum all the other stages of register 18, and multiplication logic 28 multiplies the sum by 2 to produce g(n). Summing logic 26 sums f(n) and g(n). Finally, multiplication logic 30 multiplies the sum from summer 26 by 1.27/K to generate $A_M(K)$, the RMS average value of the Mth harmonic over K successive sampling windows. The factor 1.27 is a conversion factor; it is the approximate ratio between summing the absolute values and taking the square root of the sum of the squares.

The invention can be further extended by averaging the RMS value $A_M(K)$ over a number of RMS values. This is simply done by shifting the register 18, loading in the next $Y_M(n)$, recomputing $A_M(K)$, and adding the previous RMS value to the new value. If this is done P times and the accumulated values of $A_M(K)$ are divided by P, this average $A_M(K)$ derives an enhanced RMS value from only an additional few samples; i.e., the additional samples were shifted in rather than reloading the entire shift register.

An embodiment of the invention to implement the averaging of RMS values $A_M(K)$ is illustrated in the Table of FIG. 5. The table assumes that L=P. In this averaging embodiment, the stages of shift register 18 in FIG. 2 would be weighted in accordance with the coefficients in the table columns. Stage "0" corresponds to stage 16 in register 18; i.e., $|Y_M(0)|$. The weighted outputs of the stages would simply be summed, and the sum would be multiplied by 1.27/K. For example in FIG. 5, P column labelled "4" indicates that four RMS values would be averaged and L would be chosen to be 4.

Figure 3A:
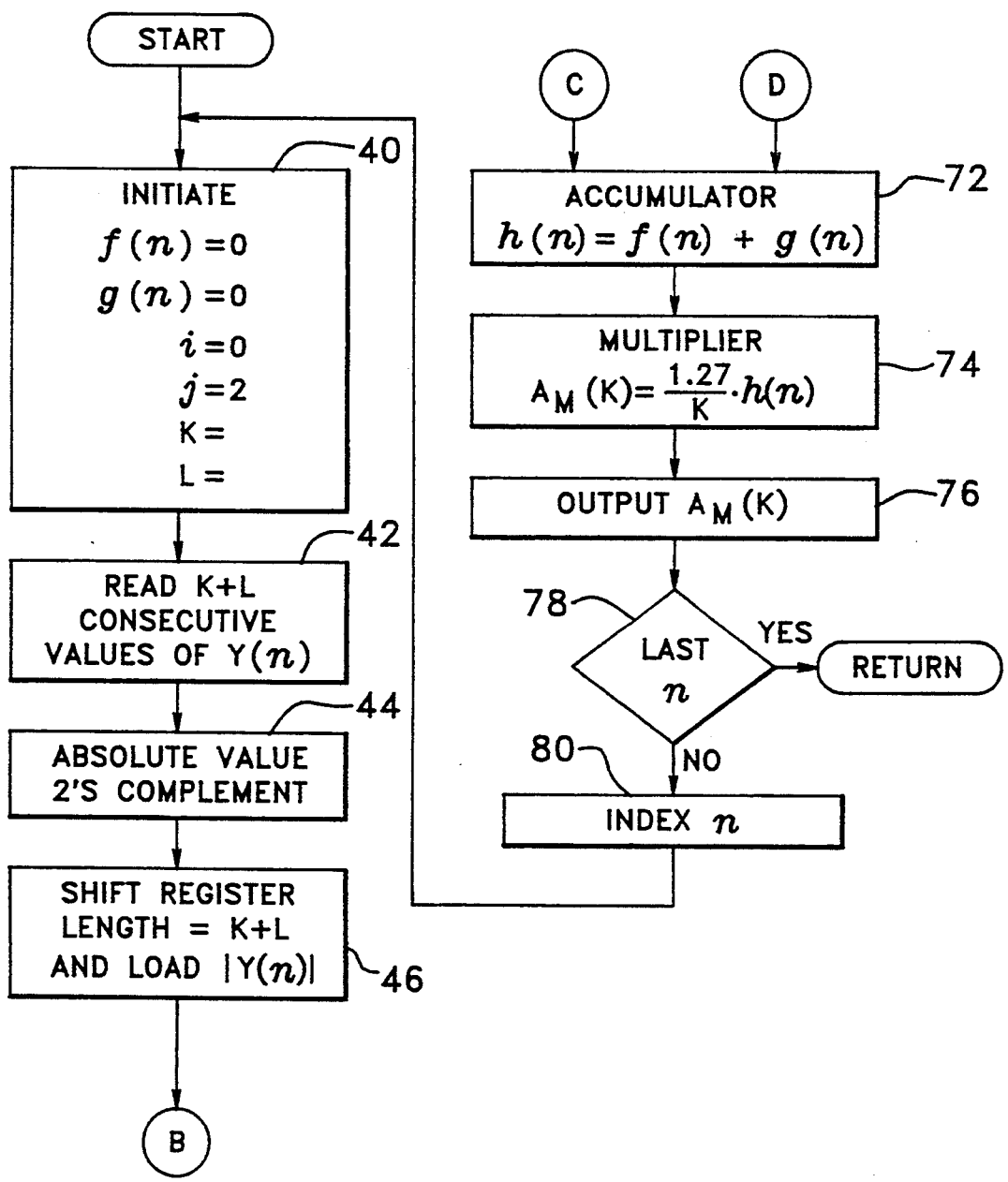
FIGS. 3A and 3B show the process or logic flow for a digital signal processor implementation of the invention.
Figure 3B:
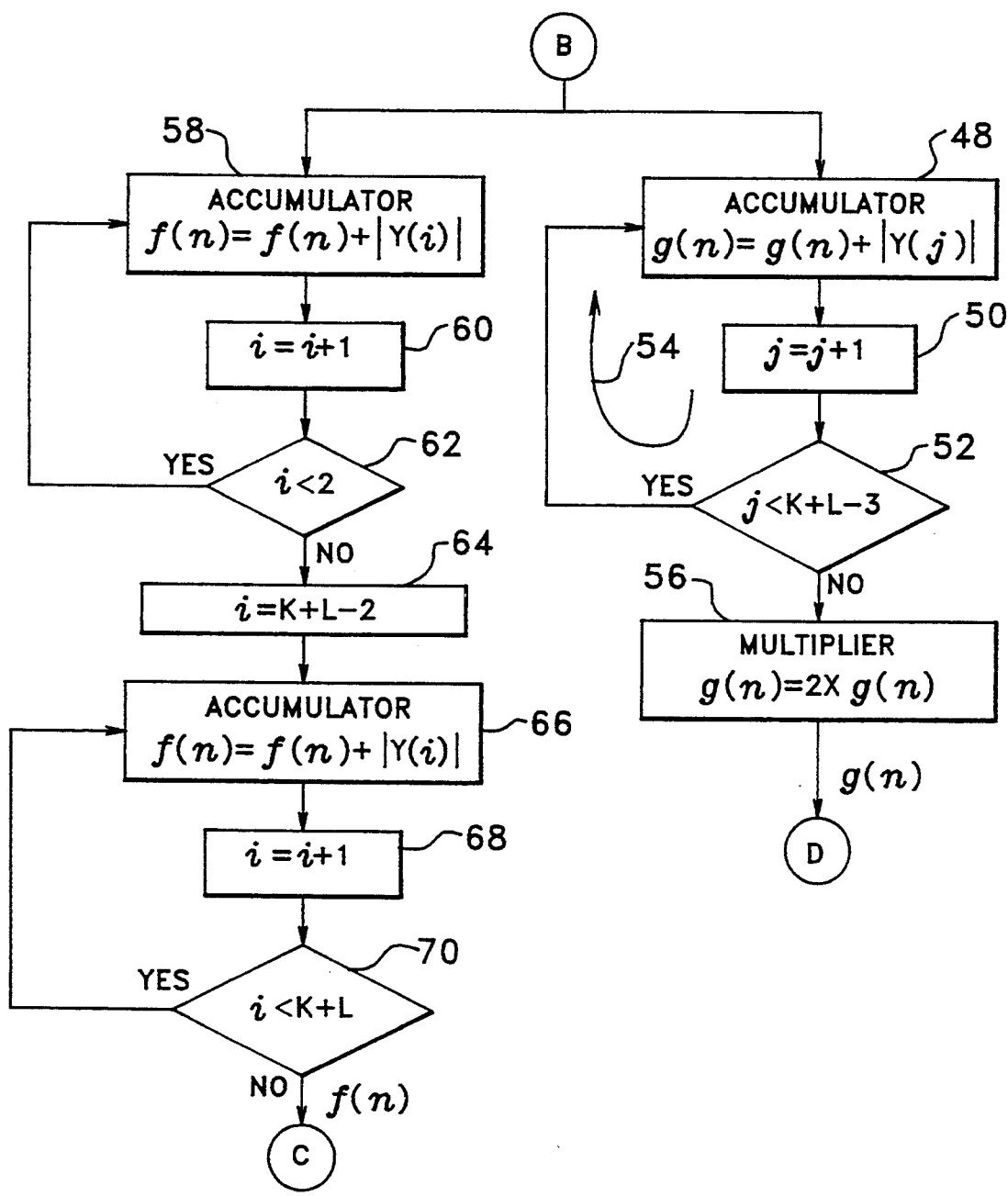

An alternative embodiment of the invention using a digital signal processor is illustrated by the process, or logic, flow in FIGS. 3A and 3B. The digital signal processor would have working memory in RAM and the RMS amplitude estimator program in ROM. The amplitude estimation process begins in FIG. 3A at initialization operation 40. f(n), g(n) and i are set to zero, and j is set to 2. As will be apparent hereinafter, i is used to index the computation of f(n), and j is used to index the computation of g(n).

K and L would also be initialized by their values would be chosen by the application designer depending on the number of samples L desired in the first harmonic and depending on the number K of successive RMS values to be averaged. Once the designer makes the desired selection of K and L, the values would be fixed in the estimation program and initialized by operation 40.

Operation 42 reads successively a total of K+L consecutive values of the amplitude of the Mth harmonic component as received from filter 12 (FIG. 1). Any negative amplitude values are converted to positive number or absolute value by two's complement operation 44. After each amplitude value is read and converted to an absolute value, shift register operation 46 loads each value |Y(n)| into a FIFO buffer, memory workspace, multiple registers, etc., that may be addressed in a manner similar to a shift register.

Next, two parallel threads in the program, as shown in FIG. 3B, compute f(n) and g(n). Accumulating operation 48 accumulates the value for g(n). Since g(n) is initialized to zero and j is initialized to two, operation 48 starts by accumulating |Y(2)|. Step 50 increments j by one and decision 52 tests whether j<K+L−3. If the answer is YES, accumulation operation 48 adds |Y(3)| to g(n). Loop 54 continues until j>K+L−3, which would be equivalent to reaching the second to the last stage in shift register 18 (FIG. 2). At this point, accumulation operation 48 will have accumulated the sum of:

$$|Y(2)| + |Y(3)| + |Y(4)| + \ldots + |Y(n-K-L+3)|.$$

Operation 56 multiples g(n) by 2, and the computation of g(n) is complete.

Accumulation operation 58 accumulates the value for f(n) contributed by the first two stages of the shift register. Initially, f(n) and i are set to zero. Accordingly, operation 58 accumulates $|Y(0)|$ as f(n). The index i is incremented by one in operation 60, and decision 62 tests whether $i>2$. At this point, $i=1$ so the process branches back to operation 58 which now adds $|Y(1)|$ to $|Y(0)|$. f(n) now contains the sum of the first two stages of the shift register.

The index i is incremented again in operation 62. Since $i=2$, the process branches from decision 62 to set operation 64. The index i is now set to $K+L-2$. Accumulate operation 66 then adds $|Y(K+L-2)|$ (the absolute amplitude value in the next to the last stage of the shift register) to f(n) accumulated value from operation 58. Step 68 increments i by one, and decision 70 tests whether $i<K+L$. If the answer is YES, operation 66 adds $|Y(K+L-1)|$ (the value of Y in the last stage) to the accumulated value for f(n). The index i is again incremented; $i=K+L$. The process flows to accumulation operation 72 in FIG. 3A.

Operation 72 waits to receive both f(n) and g(n), and then sums the two values to produce a sum value h(n). The sum h(n) is multiplied by $1.27/K$ in operation 74 to produce $A_M(K)$, the RMS value averaged over K sampling windows for the Mth harmonic of the digital sample sequence of the periodic waveform. The average RMS value is loaded into an output register by operation 76. The RMS value is then available as amplitude information about the periodic waveform being processed.

Decision 78 asks whether further RMS values are necessary by asking if the last sample index n has been processed. If the answer is yes, RMS estimation program returns program control to the main program operating the digital signal processor. If not, the next index n is retrieved and operation 40 again initializes the digital signal processor to estimate the RMS value.

Theory of Operation

In order that one skilled in the art might understand how to construct equivalent estimators, the theory behind the embodiments of the invention will now be described. First, the estimator is working with the harmonics of the digital sample value sequence. Accordingly, the amplitude of the nth sample of the Mth harmonic is:

$$Y_M(n) = A_M * \sin(w_M * n) \quad (1)$$

Where:

$$w_M = (2\pi M)/L = M w_1. \quad (2)$$

From expression (2) it follows that $w_1$, the frequency of the first harmonic is given by:

$$w_1 = 2\pi T_o/T_L,$$

which reduces to $$w_1 = 2\pi/L. \quad (3)$$

L is an integer which will be equivalent to the period of the first harmonic divided by the sampling period $T_o$.

The n+Nth sample of the digital bandpass filter for the Mth harmonic is given by:

$$Y_M(n+N) = A_M * \sin[(n+N)w_M]. \quad (4)$$

This can be rewritten as:

$$Y_M(n+N) = A_M * [\sin(nw_M)\cos(Nw_M) + \cos(nw_M)\sin(Nw_M)]$$

which, if $Nw_M$ is selected so that $\cos(Nw_M) = 0$, reduces to:

$$Y_M(n+N) = A_M * \cos(nw_M). \quad (5)$$

The condition for equation (5) is satisfied if:

$$Nw_M = (2j+1)\pi/2, \text{ where } j=0, 1, 2, \quad (6)$$

Substituting equation (2) into equation (6) and solving for L:

$$L = 4MN/(2j+1), \text{ where } j=0, 1, 2, \quad (7)$$

This is the condition for sampling that simplifies the computation of the RMS value in the following manner.

To obtain root mean square it would be necessary to square $Y_M(n)$. Therefore from expression (1):

$$Y_M^2(n) = A_M^2 * \sin^2(nw_M) \quad (8)$$

and from expression (5):

$$Y_M^2(n+N) = A_M^2 * \cos^2(nw_M)$$

which can be expressed as:

$$Y_M^2(n+N) = A_M^2 - A_M^2 * \sin^2(nw_M). \quad (9)$$

Substituting equation (8) into equation (9) and solving for $A_M$:

$$A_M = \sqrt{Y^2(n) + Y^2(n+N)}. \quad (10)$$

Accordingly, equation 10 shows that, when the conditions of equation (7) are satisfied, the estimated amplitude of the Mth harmonic component is the square root of the sum of the squares of $Y(n)$ and $Y(n+N)$.

FIG. 4 is a table of choices available for L an N when $M=3$, the third harmonic. L and N must be integers and must satisfy equation (7). The right-most column indicates the form of expression 10 for the choice made.

The estimation can be averaged in the root mean square sense by averaging over K estimations; i.e.:

$$A_M(K) = \sqrt{(1/K) \sum_{i=0}^{K-1} [Y_M^2(n+i) + Y_M^2(n+N+i)]}. \quad (11)$$

Expression (11) can be closely approximated by summing absolute values in which case the expression for the RMS value becomes:

$$A_M(K) = (1.27/K) \sum_{i=0}^{K-1} [|Y_M(n+i)| + |Y_M(n+N+i)|]. \quad (12)$$

The absolute value approximation (12) of the root mean square expression (11) is implemented in this invention, as discussed above. One skilled in the art will appreciate that it is far easier to implement expression (12) than expression (11). In addition, since there are no squares are square roots in expression (12), its implementation will run much faster than an implementation of expression (11).

It will be appreciated by one skilled in the art that no matter how implemented, two significant functional characteristics of our invention are the sampling choices of N, L and M to simplify the computation of $A_M$, and the squaring of $Y(n)$ and $Y(n+N)$ to arrive at simplified logic or process to find amplitude information through the RMS value. While a number of preferred embodiments of the invention have been shown and described, it will be appreciated by one skilled in the art, that a number of further variations or modifications may be made without departing from the spirit and scope of our invention.

What is claimed is:

1. Digital apparatus for estimating the amplitude of a periodic signal by generating a digital signal proportional to the root mean square (RMS) value of a harmonic component of the periodic signal, said apparatus comprising:

means for digitally sampling the periodic signal at an L sampling rate to digitize the periodic signal into digital samples where L is an integer number of sampling intervals in one period of a first harmonic component of the periodic signal;

means for filtering said digital samples to output for each digital sample a digital amplitude value for Mth harmonic component of the digitized periodic signal;

means for converting each digital amplitude value into an absolute value;

shift register means having K+L register stages where K is the number of successive sampling windows, each window containing N digital samples, and where L is an integer defined by the expression $4MN/(2j+1)$ where M is the harmonic number of said Mth harmonic component and j is a positive integer;

said shift register means responsive to said converting means for loading the absolute value of each digital amplitude value sequentially into said shift register means and for shifting the absolute values through said stages; and means for summing the absolute values from the stages of said shift register means to generate a digital RMS signal proportional to RMS value of the Mth harmonic component of the periodic signal.

2. The apparatus of claim 1 and in addition:

means for averaging over a predetermined number of said digital samples the digital RMS signals generated by said summing means.

3. Apparatus for generating a digital amplitude signal proportional to the amplitude of a periodic signal, said apparatus comprising:

means for digitally sampling the signal to produce a sequence of digitized samples of the periodic signal;

means for filtering the sequence of digitized samples to produce for each digitized sample a digital, absolute, amplitude value of a harmonic component of the sequence of digitized samples;

said sampling means using a sampling period $T_o$, where $T_o = LT_L$, and $T_L$ is the period of the first harmonic of the periodic signal, and L is an integer defined by the expression $4MN/2(j+1)$ where M is the harmonic number of said harmonic component, N is a predetermined number of samples within a sampling window, and j is a positive integer; and means responsive to said filtering means for accumulating said digital amplitude signal proportional to the amplitude of the harmonic component and thereby the amplitude of the periodic signal.

4. Method for estimating amplitude of a periodic signal, said method comprising the steps of:

digitally sampling the periodic signal to produce digital samples of the periodic signal in a digitized sample sequence;

filtering the digitized sample sequence to produce for each digital sample a digital, absolute, amplitude value of a harmonic component of the digital samples;

said sampling step using a sampling period $T_o$, where $T_o = LT_L$, and $T_L$ is the period of the first harmonic of the periodic signal, and L is an integer defined by the expression $4MN/(2j+1)$ where M is the harmonic number of said harmonic component, N is a predetermined number of samples within a sampling window, and j is a positive integer; and summing the digital, absolute, amplitude values to generate a digital amplitude signal proportional to the amplitude of the harmonic component of the digital samples.

5. The method of claim 4 and in addition:

said sampling step sampling the periodic signal with a plurality of said sampling windows, the sampling windows being successive and overlapping; and averaging successive digital amplitude signals generated by said summing step for the plurality of successive sampling windows.

* * * * *